(12) United States Patent
Yagyu et al.

(10) Patent No.: US 7,462,889 B2
(45) Date of Patent: Dec. 9, 2008

(54) AVALANCHE PHOTODIODE

(75) Inventors: Eiji Yagyu, Tokyo (JP); Nobuyuki Tomita, Tokyo (JP); Eitaro Ishimura, Tokyo (JP); Masaharu Nakaji, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 115 days.

(21) Appl. No.: 11/088,770

(22) Filed: Mar. 25, 2005

(65) Prior Publication Data

US 2005/0224839 A1 Oct. 13, 2005

(30) Foreign Application Priority Data

Mar. 29, 2004 (JP) ............................. 2004-094722

(51) Int. Cl.
*H01L 31/107* (2006.01)
(52) U.S. Cl. ................. 257/186; 257/183; 257/184; 257/199; 257/438; 257/603; 257/E31.063
(58) Field of Classification Search ............... 257/186, 257/E31.063
See application file for complete search history.

(56) References Cited

U.S. PATENT DOCUMENTS

| 4,794,439 | A | * | 12/1988 | Webb et al. ............. 257/12 |
| 5,552,629 | A | | 9/1996 | Watanabe |
| 5,937,274 | A | * | 8/1999 | Kondow et al. ........... 438/47 |
| 6,104,047 | A | * | 8/2000 | Watanabe ............... 257/186 |
| 6,495,380 | B2 | * | 12/2002 | Clark et al. .............. 438/22 |
| RE38,072 | E | * | 4/2003 | Kondo et al. ............. 438/47 |
| 6,664,573 | B2 | * | 12/2003 | Kim et al. .............. 257/186 |
| 6,670,600 | B2 | * | 12/2003 | Terano et al. .......... 250/214.1 |
| 6,693,337 | B2 | * | 2/2004 | Yoneda et al. ........... 257/436 |
| 6,794,631 | B2 | * | 9/2004 | Clark ................. 250/214.1 |
| 6,924,541 | B2 | * | 8/2005 | Yoneda et al. ........... 257/459 |
| 7,187,013 | B2 | * | 3/2007 | Nakaji et al. ........... 257/186 |
| 2002/0135036 | A1 | * | 9/2002 | Terano et al. ........... 257/458 |
| 2005/0230706 | A1 | * | 10/2005 | Yagyu et al. ........... 257/186 |
| 2005/0263787 | A1 | * | 12/2005 | Ishimura et al. ......... 257/186 |

OTHER PUBLICATIONS

Isao Waranabe, et al., "High-Speed, High-Reliability Planar-Structure Superlattice Avalance Photodiodes for 10-Gb/s Optical Recievers", IEEE, Journal of Lightwave Technology, vol. 18, No. 12, Dec. 2000, pp. 2200-2207.
U.S Appl. No. 11/088,770, filed Mar. 25, 2005, Yagyu et al.
U.S. Appl. No. 11/098,558, filed Apr. 5, 2005, Yagyu et al.

* cited by examiner

*Primary Examiner*—Andy Huynh
*Assistant Examiner*—Hoang-Quan Ho
(74) *Attorney, Agent, or Firm*—Oblon, Spivak, McClelland, Maier & Neustadt, P.C.

(57) ABSTRACT

An avalanche photodiode according to this invention include a light receiving region 101 surrounded by a ring-shaped trench 13, a first electrode 11 formed on the light receiving region 101, a second electrode 12 formed on the periphery of the ring-shaped trench 13 surrounding the light receiving region, a first semiconductor layer lying just under the first electrode 11, and a second semiconductor layer lying just under the second electrode 12. Conductivity types of the first semiconductor and the second semiconductor are identical.

8 Claims, 7 Drawing Sheets

US 7,462,889 B2

AVALANCHE PHOTODIODE

BACKGROUND OF THE INVENTION

1. Field of the Invention

The present invention relates to avalanche photodiodes that are excellent in high-frequency characteristics and can be manufactured in a high yield.

2. Description of the Related Art

A conventional avalanche photodiode, for example, as represented in U.S. Patent Publication 5,552,629, includes crystalline layers grown on a $p^+$ type InP substrate 11, which are each a $p^+$ type InP buffer layer 12, a $p^-$ type InGaAs light absorption layer 13, a $p^+$ type InP field-buffer layer 14, an $n^-$ type InAlGaAs/InAlAs superlatice multiplication layer 15, an $n^+$ type InAlAs cap layer 16, and an $n^+$ type InGaAs contact layer 17. A ring-shaped trench is formed around the $n^+$ type InAlAs cap layer 16 and the $n^+$ type InGas contact layer 17. A $p^+$ type conductivity region that reaches the $p^+$ type InP field-buffer layer 14 is formed outside of the ring-shaped trench by Zn selective thermal diffusion. A circular n-type electrode 18 is provided on the top of a light receiving region composed of the superlatice multiplication layer 15, cap layer 16, and contact layer 17.

The above described avalanche photodiode, which has the ring-shaped $p^+$ type conductivity region provided around the n-type light receiving region, prevents a depletion layer that extends from their pn junction from reaching the side face portion of the light receiving region, when a reverse bias voltage is applied, thereby realizing low-dark-current and high-reliability. The ring-shaped $p^+$ type conductivity region is formed by the Zn selective thermal diffusion process, which requires high cost and decrease yield of the device fabrication and. It is therefore, a primary object of the invention to provide an avalanche photodiode that is excellent in high-frequency characteristics and can be easily produced in a high-yield.

SUMMARY OF THE INVENTION

An avalanche photodiode according to the present invention includes: a light receiving region surrounded by a ring-shaped trench; a first electrode formed on the light receiving region; a second electrode formed on the periphery of the ring-shaped trench surrounding the light receiving region; a first semiconductor layer lying just under the first electrode; and a second semiconductor layer lying just under the second electrode, the conductivity type of the first semiconductor and the conductivity type of the second semiconductor being identical.

DETAILED DESCRIPTION OF THE PREFERRED EMBODIMENTS

Embodiment 1

Figure 1A:
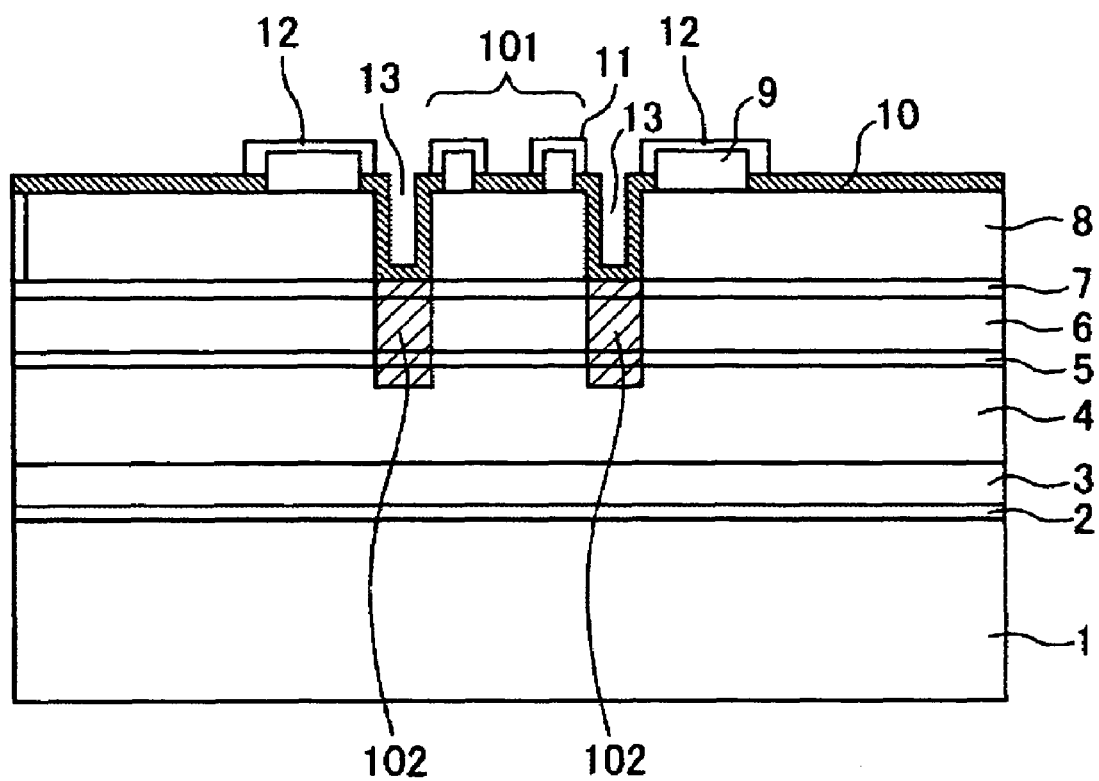
FIGS. 1 and 8 are diagrams illustrating various parts of an avalanche photodiode according to Embodiment 1 of the present invention.

FIGS. 1(a) and (b) are diagrams illustrating a cross-sectional view and a top view of an avalanche photodiode according to Embodiment 1 of the present invention. The avalanche photodiode illustrated in FIG. 1 is includes a semi-insulating semiconductor substrate 1, an $n^+$ type buffer layer 2, a $p^+$ type buffer layer 3, a light absorption layer 4, a first-conductivity-type field-buffer layer 5; an avalanche multiplication layer 6, a stop-etch layer 7, a second-conductivity-type cap layer 8, a second-conductivity-type contact layer 9, a passivation film 10, a first electrode 11, and a second electrode 12. A ring-shaped trench 13 is formed in the second-conductivity-type cap 8.

Figure 1B:
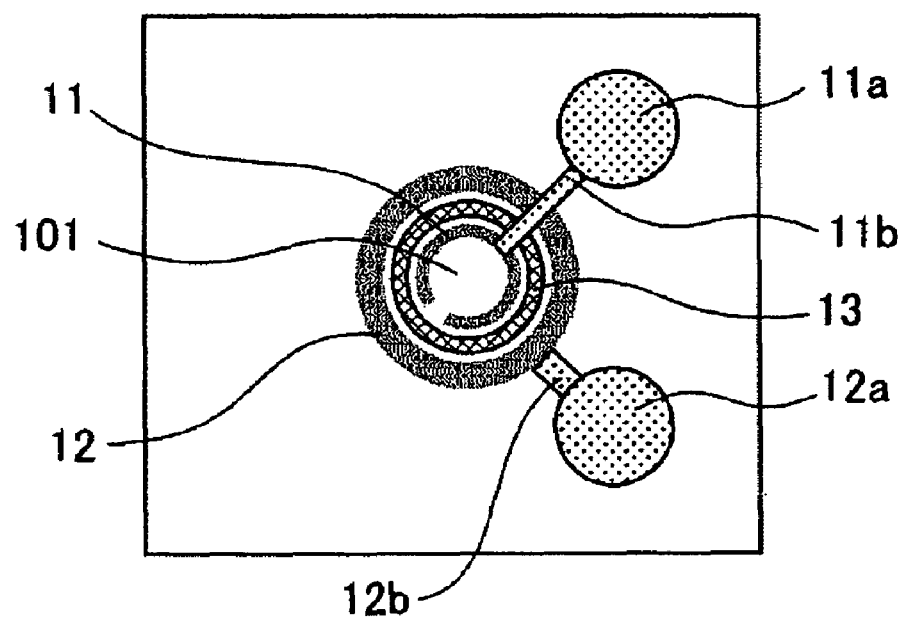
Figure 2:
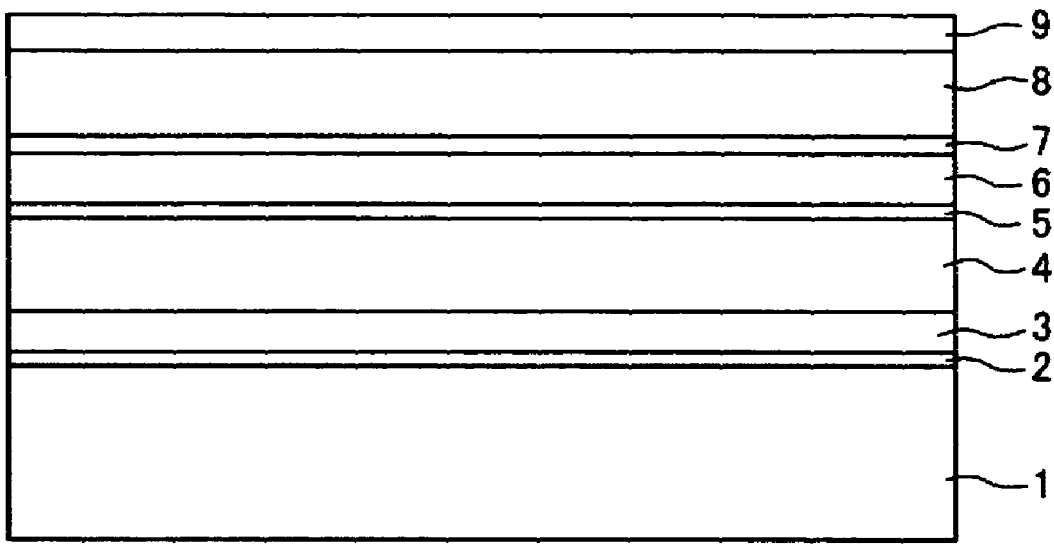
FIGS. 2-4 are diagrams illustrating a method of producing the avalanche photodiode according to Embodiment 1 of the present invention.
Figure 3:
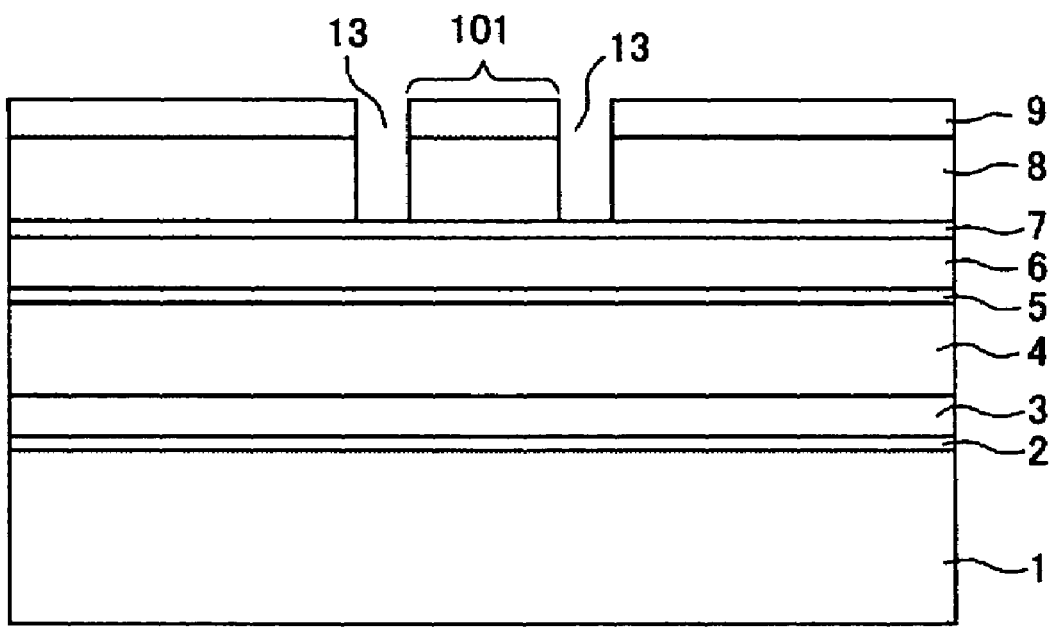
Figure 4:
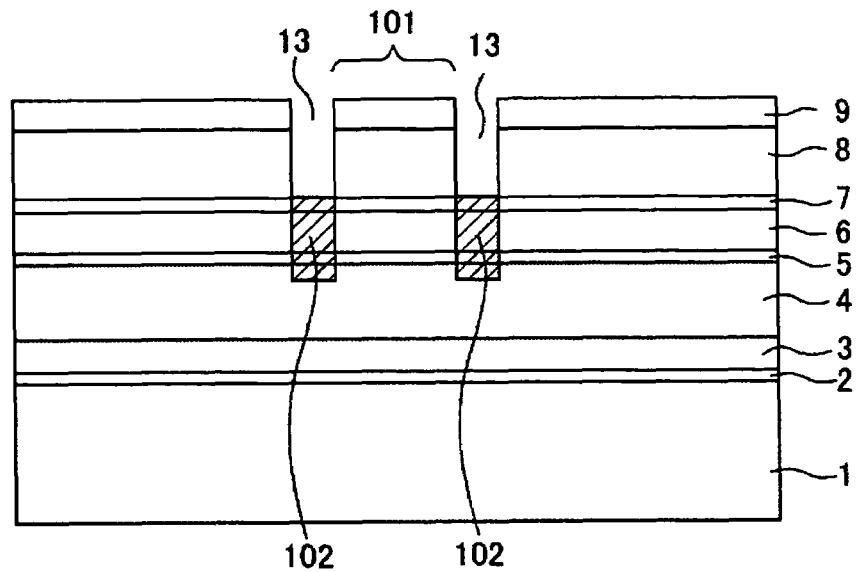

FIGS. 2-4 are diagrams illustrating a method for producing the avalanche photodiode represented in FIG. 1. As illustrated in FIG. 2, each of the layers from the $n^+$ type buffer layer 2 made of $n^+$ type InP to the contact layer 9 made of $n^+$ type GaInAs is sequentially formed on the semi-insulating substrate 1 made of InP by an epitaxial method. The $n^+$ type InP buffer layer 2 having thickness of 0.2-1.0 µm is at first formed on the semi-insulating InP substrate 1, then the buffer layer 3, having its thickness of 0.5-1.0 µm and being made of $p^+$ type InP, is formed on the $n^+$ type InP buffer layer 2. The light absorption layer 4, having thickness of 1.0-1.5 µm and being made of non-doped i-type or $p^-$ type GaInAs with carrier density of approximately $1 \times 10^{16}$ cm$^{-3}$, is formed on the $p^+$ type InP buffer layer 3. The first-conductivity-type field-buffer layer 5, having thickness of 0.01-0.05 µm and being made of $p^+$ type InP with carrier density of $0.5-1 \times 10^{18}$ cm$^{-3}$, is formed on the GaInAs light absorption layer 4. The avalanche multiplication layer 6, having thickness of 0.1-0.3 µm and being non-doped i-type or n type AlInAs with carrier density of approximately $5 \times 10^{15}$ cm$^{-3}$, is formed on the $p^+$-type-InP first-conductivity-type field-buffer layer 5. The stop-etch layer 7, having thickness of 0.005-0.05 µm and being made of non-doped i-type InP, is formed on the $n^-$-type-AlInAs avalanche multiplication layer 6. The second-conductivity-type cap layer 8, having thickness of 0.5-1.0 µm and being made of $n^+$ type AlInAs with carrier density of $1-10 \times 10^{19}$ cm$^{-3}$, is formed on the i-type InP stop-etch layer 7. The second-conductivity-type contact layer 9, having its layer thickness of 0.1-0.5 m and being made of $n^+$ type GaInAs with carrier density of $1-10 \times 10^{19}$ cm$^{-3}$, is formed on the $n^+$-type-AlInAs second-conductivity-type cap layer 8. Each layer can be formed with a molecular beam epitaxy (MBE) method or metal-organic vapor-phase epitaxy (MO-VPE) method, etc. using a solid source or gas source.

Next, as illustrated in FIG. 3, the $n^+$-type-GaInAs second-conductivity-type contact layer 9 and the $n^+$-type-AlInAs second-conductivity-type cap layer 8 are selectively removed by etching using mixed solution of an organic acid such as a citric acid and a hydrogen peroxide solution, so as to form the ring-shaped trench 13. A resist pattern formed by a well known lithography technique, or an $SiN_x$ or $SiO_2$ pattern formed by the resist can be used for etching mask.

Next, as illustrated in FIG. 4, titanium (Ti) ions for removing the p-type characteristics is implanted in the ring-shaped trench 13 by using heat treatment at 600° C., to form an ion implanted region 102 reaching the first-conductivity-type field-buffer layer 5. Due to the ion implanted region 102, the carrier density of the first-conductivity-type field-buffer layer 5 in the perimeter portion of a light receiving region 101 decreases. Such ion implanted region 102 functions as a guard ring. The ion implanted region 102 can be formed using H, He, N, C, O, Ar, B, or Fe.

Next, the second-conductivity-type contact layer 9 is selectively removed by an etching procedure, and the passivation film 10 such as a $SiN_x$ film used for preventing reflection is formed on the wafer surface. The passivation film 10 formed on the second-conductivity-type contact layer 9 is selectively removed. Then, the first electrode 11 is formed on the surface of the light receiving region 101 of the second-conductivity-type contact layer 9, and the second electrode 12 is formed on the surface of the second-conductivity-type contact layer 9 outside of the light receiving region 101. The first electrode 11 and the second electrode 12 are formed using an alloy such as AuZn, AuTi, AuTiPt, and AuGeNi.

As illustrated in FIG. 1(b), on the avalanche photodiode device, a first-electrode bonding pad 11a and a second-electrode bonding pad 12a are provided for connecting to exterior circuits the first electrode 11 and the second electrode 12, respectively. The first electrode 11 and the first-electrode bonding pad 11a are connected with a first-electrode lead 11b, and the second electrode 12 and the second-electrode bonding pad 12a are connected with a second-electrode lead 12b. The main portion of the avalanche photodiode illustrated in FIG. 1 is completed with above described procedures.

The avalanche photodiode according to the present invention illustrated in FIG. 1 has n-p-n structure in between the first electrode 11 and the second electrode 12, where reverse bias voltage is applied. The first "n" is formed by the second-conductivity-type contact layer 9 in the light receiving region 101, on which the first electrode 11 is provided, and the second-conductivity-type cap layer 8 in the light receiving region 101. The last "n" is formed by the second-conductivity-type contact layer 9 outside of the light receiving region 101, on which the second electrode 12 is provided, and the second-conductivity-type cap layer 8 outside of the light receiving region 101. The "p" is formed by the first-conductivity-type field-buffer layer 5. With the n-p-n structure created between the first electrode 11 and the second electrode 12, the selective thermal diffusion process of p-type impurities into an n-type region, an essential process in conventional general p-n structured avalanche photodiodes, can be omitted, thereby simplifying the process significantly. The accurate control of the selective thermal diffusion is difficult, and the impurities once having been diffused may diffuse again in a later heat process. So the conventional avalanche photodiodes with p-n structure is extremely difficult to manufacture in a high yield.

In the avalanche photodiode according to the present invention, a portion of the second-conductivity-type cap layer 8 having the first electrode 11, which forms the first "n", and a portion of the second-conductivity-type cap layer 8 having the second electrode 12, which forms the second "n", are separated by the ring-shaped trench 13. The p-type layer of the first-conductivity-type field-buffer layer 5, which forms "p", is provided underneath these n-type layers. This n-p-n configuration does not require selective thermal diffusion process of the p-type impurities. Therefore, high yield manufacturing can be realized.

Figure 5:
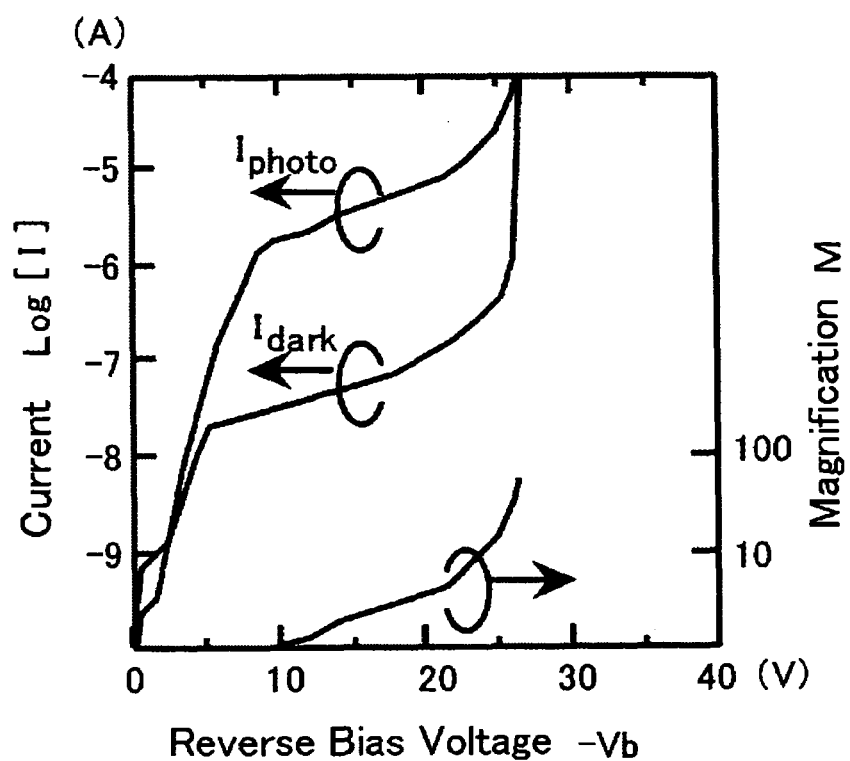
FIGS. 5-7 are diagrams illustrating device characteristics of the avalanche photodiode according to Embodiment 1 of the present invention.
Figure 6:
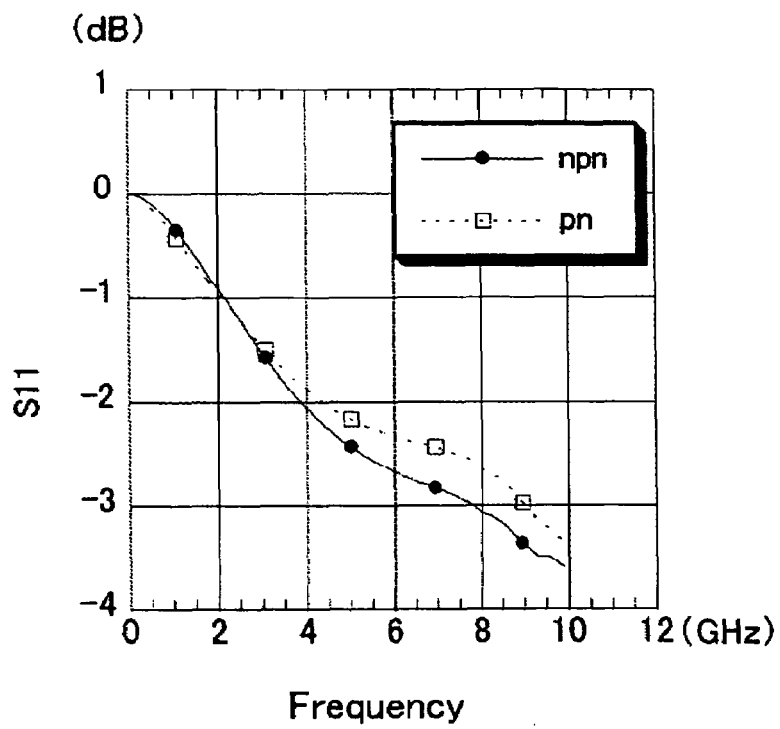
Figure 7:
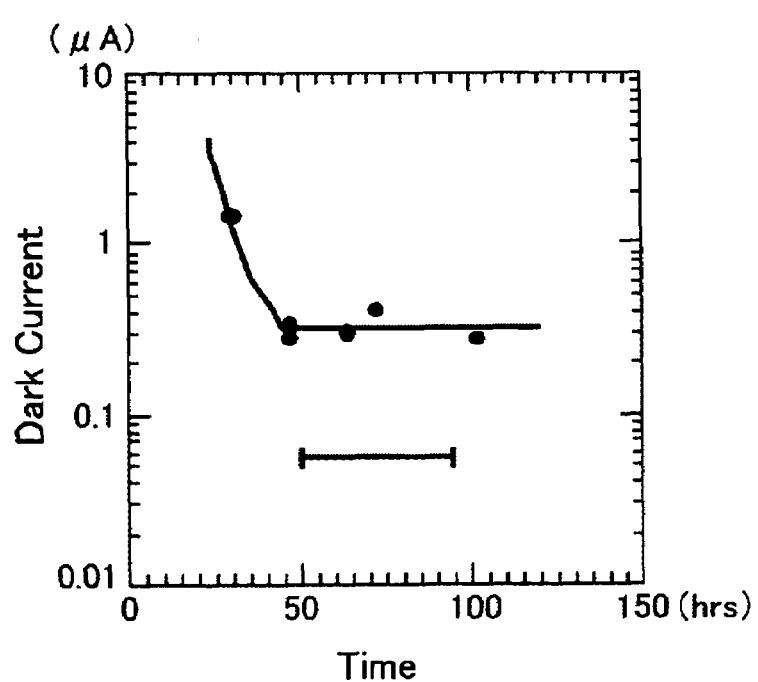
Figure 8:
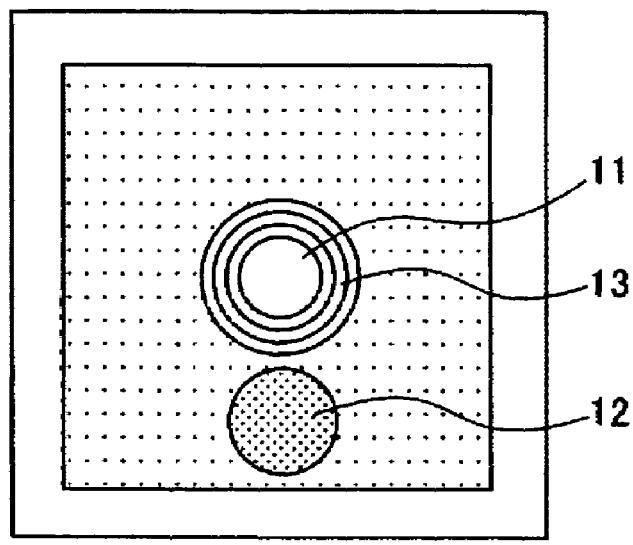

FIGS. 5-7 are diagrams illustrating device characteristics of the avalanche photodiode according to the embodiment. FIG. 5 represents characteristics of photo-current $I_{photo}$, dark current $I_{dark}$, and their magnification M in response to reverse bias voltage $-V_b$. As represented in FIG. 5, in the avalanche photodiode according to the embodiment, neither the edge break-down nor the tunnel break-down occurs until the reverse bias voltage $-V_b$ reaches in the proximity of 27 V. In addition, the avalanche magnification M of approximately 50 times is realized. That is, the device characteristics represented in FIG. 5 indicates that the avalanche photodiode according to the present invention employing the n-p-n structure has an excellent performance. This result also shows that the guard ring of the ion implanted region 102 functions enough.

FIG. 6 is a diagram showing S11 parameters of the avalanche photodiode with conventional p-n structure and the avalanche photodiode with the n-p-n structure according to this invention. In FIG. 6, the vertical axis represents the S11 parameter, and the horizontal axis represents frequency. The electrode capacity of the equivalent circuit constructed based on the characteristics illustrated in FIG. 6 proved that the electrode pad capacity in the avalanche photodiode according to this embodiment can be reduced by approximately 20%, compared with conventional structure one. This means that the avalanche photodiode according to this embodiment has excellent high-frequency characteristics.

FIG. 7 is a diagram representing reliability test results of the avalanche photodiode according to this embodiment, which is operated with a 100 μA constant-current at 175° C. In FIG. 7, the horizontal axis represents operation time, and the vertical axis represents dark current values when the magnification M becomes 10. As illustrated in FIG. 7, after the dark current values of the device drastically decrease at the initial aging step and stabilize, the device operates normally. The activation energy of the avalanche photodiode mainly composed of InP is estimated to be equal to or higher than 1.0 eV. This value is equivalent to an operation time of one million hours at operational temperature of 50° C. This result represents that the n-p-n structured avalanche photodiode according to this embodiment has adequate reliability in practical use.

In the avalanche photodiode illustrated in FIG. 1, a light is incident from the upper side of the semiconductor substrate 1, however, the avalanche photodiode maybe structured so that the light is incident from back face side of the semiconductor substrate 1. In this case, the first electrode 11 does not need to be connected from the light receiving region 101 to the outside of the ring-shaped trench 13, so the flip-chip bonding method becomes applicable.

Embodiment 2

FIGS. 9-12 are diagrams illustrating other configurations of the avalanche photodiode illustrated in FIG. 1.

Figure 9:
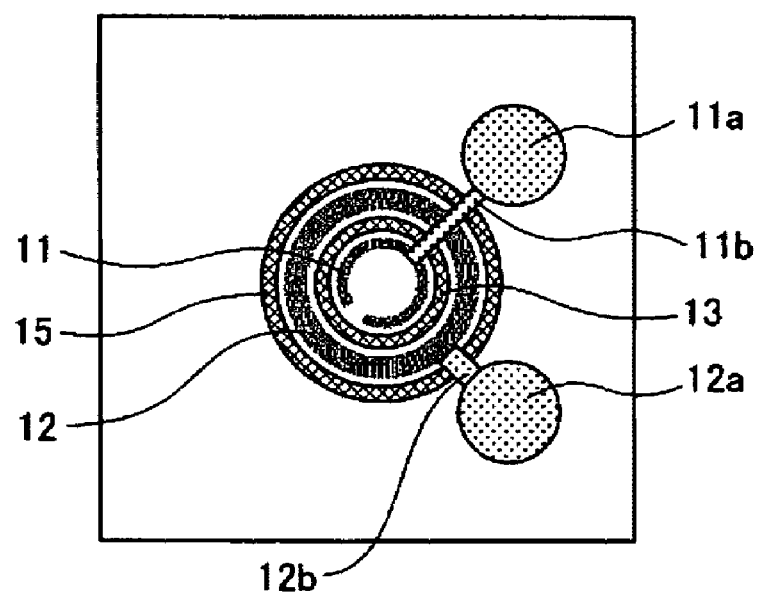
FIGS. 9-12 are diagrams illustrating avalanche photodiodes according to Embodiment 2 of the present invention
Figure 10:
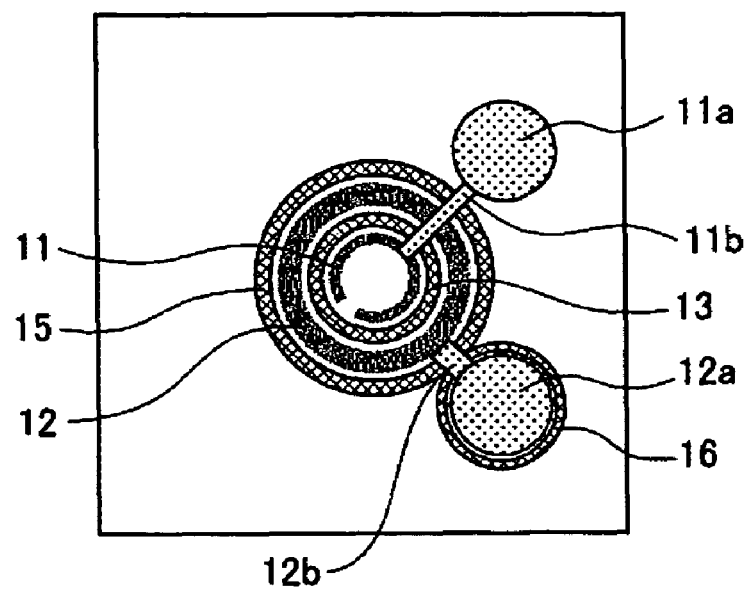
Figure 11:
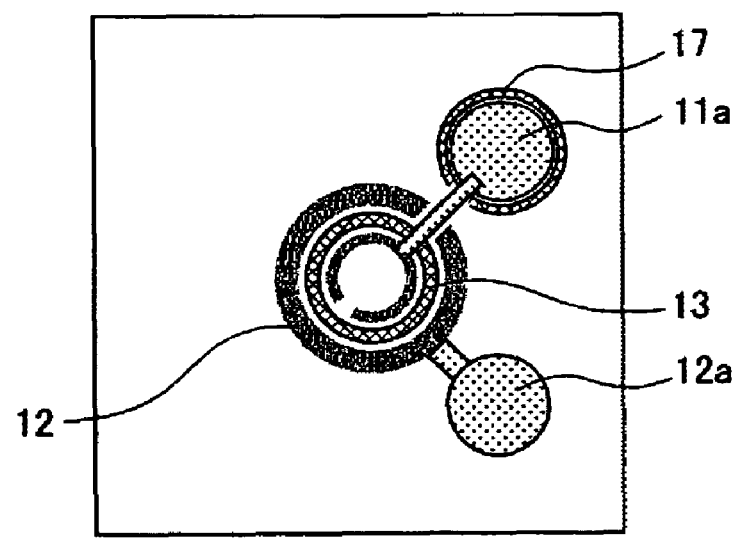
Figure 12:
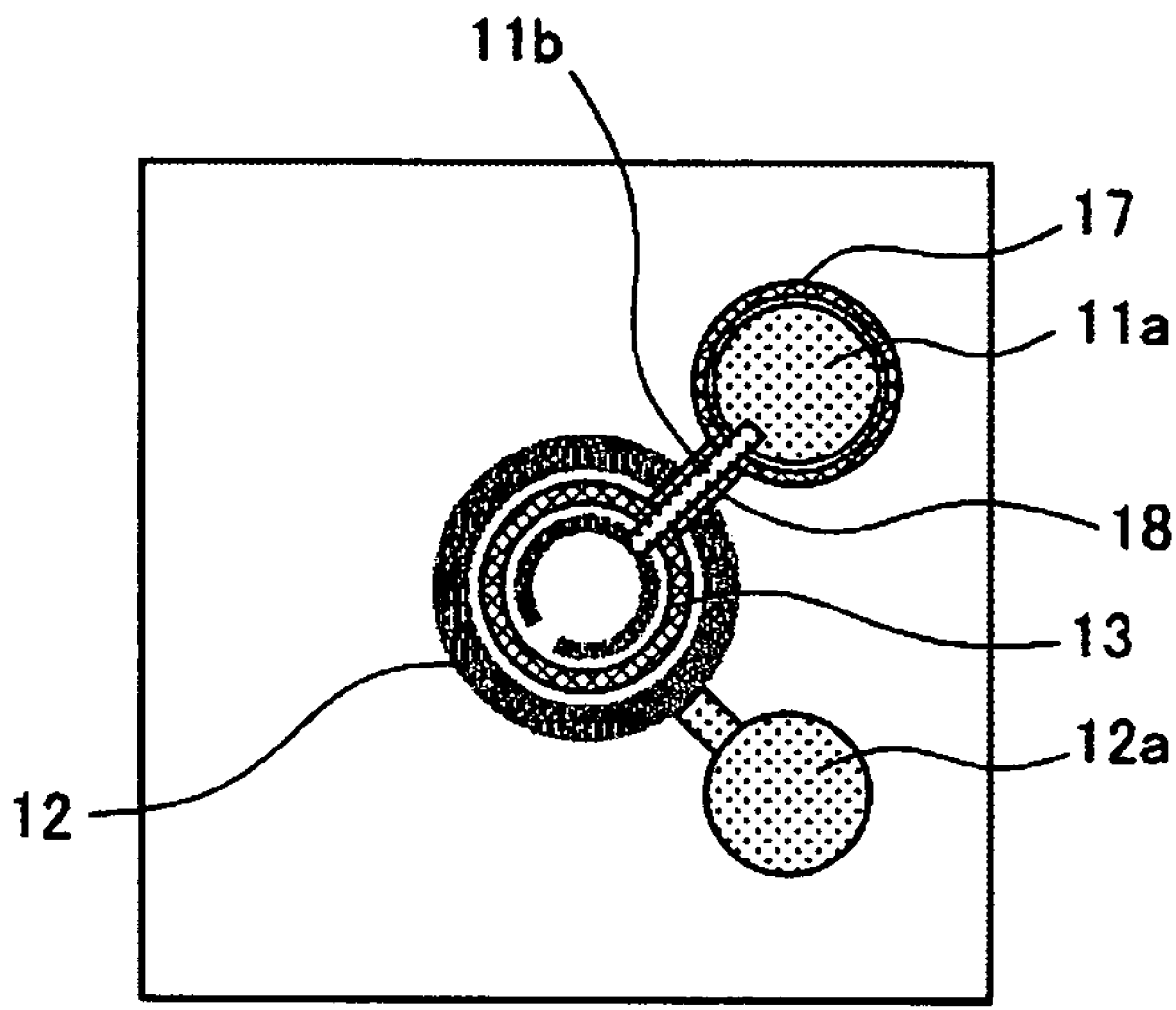

In a device structure illustrated in FIG. 9, an exterior ring-shaped trench 15 is provided around the second electrode 12. In a device structure illustrated in FIG. 10, a trench 16 is provided around the second-electrode bonding pad 12a. In a device structure illustrated in FIG. 11, a ring-shaped trench 17 is provided around the first-electrode bonding pad 11a. In a device structure illustrated in FIG. 12, a wiring trench 18 is provided along both the sides of the first-electrode lead 11b.

Each of the trenches illustrated in FIGS. 9-12 is formed by removing the second-conductivity-type contact layer 9 and the second-conductivity-type cap layer 8 with a selective etching process. By forming each of the trenches and the ring-shaped trench 13 at the same time, the manufacturing process becomes simpler. The effective electrode capacity can be further reduced by forming the above described trenches, so a higher-speed operation can be realized.

Either A p-type semiconductor substrate or an n-type semiconductor substrate can be used for the semiconductor substrate 1. When a p-type semiconductor substrate is used, the second electrode 12 outside of the light receiving region 101 may be provided on the back face side of the semiconductor substrate 1 without providing the n+ type InP buffer layer 2. When an n-type semiconductor substrate is used, the second electrode 12 outside of the light receiving region may be provided on the back face side of the semiconductor substrate 1 without providing the p+ type InP buffer layer 3. In the avalanche photodiode according to the present invention, the ionizing rate of electrons in the avalanche multiplication layer 6 should be higher than that of holes. The avalanche multiplication layer 6 can be formed with a superlatice structure composed of $Al_xGa_yIn_{1-x-y}$, $Ga_xIn_{1-x}As_yP_{1-y}$, a compound semiconductor including antimony (Sb), or their mixture.

Furthermore, by reversing the n-type layer and p-type of the avalanche multiplication layer 6, InP which has higher ionizing rates of the holes, can be used for a p-type avalanche multiplication layer 6.

What is claimed is:

1. An avalanche photodiode comprising:
   a semiconductor substrate;
   a light absorption layer, a field-buffer layer of a first conductivity type, an avalanche multiplication layer, a cap layer of a second conductivity type, and a contact layer of the second conductivity type, each said layer being formed on the semiconductor substrate;
   a ring-shaped trench formed in the second-type conductivity cap layer and the second-type conductivity contact layer;
   a light receiving region surrounded by the ring-shaped trench;
   a first electrode electrically connected to the second-type conductivity contact layer in the light receiving region; and
   a second electrode in immediate physical contact with and electrically connected to the second-type conductivity contact layer, the second electrode being formed so as to surround the ring-shaped trench in a region outside of the light receiving region.

2. An avalanche photodiode according to claim 1, further comprising:
   a stop-etch layer between the avalanche multiplication layer and the cap layer, wherein the position of the bottom of the ring-shaped trench approximately coincides with the position of the top of the stop-etch layer.

3. An avalanche photodiode according to claim 1, wherein both the semiconductor substrate and the field-buffer layer are composed of indium phosphide (InP).

4. An avalanche photodiode according to claim 1, further comprising:
   an ion implanted region provided so as to penetrate the avalanche multiplication layer from the bottom of the ring-shaped trench.

5. An avalanche photodiode according to claim 1, wherein the second electrode has a ring shape which is partially broken and the avalanche photodiode further comprises:
   a first-electrode bonding pad formed on the periphery of the light receiving region, the first-electrode bonding pad being electrically connected to the first electrode through a first-electrode lead which is placed in an area where the ring shape of the second electrode is partially broken.

6. An avalanche photodiode according to claim 1, further comprising:
   an external ring-shaped trench provided on the outer side of the ring-shaped second electrode.

7. An avalanche photodiode according to claim 1, further comprising:
   a second-electrode bonding pad provided close to the second electrode, the second-electrode bonding pad being electrically connected to the second electrode by a second-electrode lead.

8. An avalanche photodiode according to claim 5, wherein either or both of the first-electrode bonding pad and the second-electrode bonding pad are surrounded by bonding-pad ring-shaped.

* * * * *